United States Patent [19]
Hayes

[11] Patent Number: 6,014,093
[45] Date of Patent: Jan. 11, 2000

[54] PULSE CODING SYSTEM

[76] Inventor: Adam T. Hayes, 321 Eliot Mail Center, Cambridge, Mass. 02138

[21] Appl. No.: 09/032,575

[22] Filed: Feb. 27, 1998

[51] Int. Cl.[7] .................................................. H03M 5/08
[52] U.S. Cl. ............................................ 341/53; 375/295
[58] Field of Search ............................... 341/53, 155, 50; 375/295, 316, 296, 317

[56] References Cited

U.S. PATENT DOCUMENTS

| | | |
|---|---|---|
| 3,678,505 | 7/1972 | Mostyn, Jr. ............................. 341/170 |
| 3,745,555 | 7/1973 | Carbrey ................................... 341/172 |
| 3,855,589 | 12/1974 | Solender ................................. 341/139 |
| 3,899,754 | 8/1975 | Brolin ..................................... 341/143 |
| 4,540,973 | 9/1985 | Grallert .................................. 341/143 |
| 4,700,362 | 10/1987 | Todd et al. . | 
| 5,051,799 | 9/1991 | Paul et al. . |
| 5,136,652 | 8/1992 | Jibbe et al. . |
| 5,155,743 | 10/1992 | Jacobs . |
| 5,657,350 | 8/1997 | Hofmann . |

*Primary Examiner*—Michael Tokar
*Assistant Examiner*—Peguy Jean Pierre
*Attorney, Agent, or Firm*—Price, Heneveld, Cooper, DeWitt & Litton

[57] ABSTRACT

A pulse coding system is disclosed that includes an encoder for encoding the received analog signal as a series of output pulses, and a decoder for receiving the pulses output from the encoder and for generating an output signal corresponding to the analog signal received by the encoder. The encoder includes a first decaying signal source for generating a decaying reference signal, and a pulse-generating comparator circuit for receiving the analog signal to be encoded as well as the decaying reference signal. The pulse-generating comparator circuit compares the amplitudes of the received analog signal and the reference signal and generates and outputs a pulse whenever the amplitude of the decaying reference signal falls below that of the received analog signal. The first decaying signal source receives the generated pulses and responds to the pulses by increasing the amplitude of the decaying reference signal a predetermined amount each time a pulse is received. The decoder includes a second decaying signal source for generating the output signal by increasing the amplitude of the output signal by a predetermined amount each time a pulse is received and subsequently allowing the amplitude to decay after each increase in amplitude.

18 Claims, 7 Drawing Sheets

PULSE CODING SYSTEM

BACKGROUND OF THE INVENTION

The present invention generally relates to a system for encoding and decoding an analog signal. More particularly, the present invention pertains to a system including an encoder for encoding an analog signal as a series of pulses, and a decoder for receiving and decoding the series of transmitted pulses so as to output an analog signal corresponding to the analog signal received by the encoder.

Systems and methods are known that include an encoder for encoding an analog signal as a digital signal for purposes of enhancing transmission. Such systems include a decoder circuit that receives the transmitted digital signal and converts it back into an analog signal resembling the analog signal received by the encoder. By encoding the analog signal into a digital signal prior to transmission, the transmitted signal will be less likely to be adversely affected by noise that is present in the environment through which the signal is transmitted. One type of system used for this purpose employs linear pulse code modulation (PCM) in which the quantizing step sizes are constant. Such systems, however, require a relatively broad transmission bandwidth to have sufficient resolution. Further, PCM systems typically employ high precision components that are relatively expensive.

Other systems used to encode and decode analog signals are delta modulation systems. Although delta modulation systems are typically less expensive, they generally require much higher bit rates than PCM systems if it is desired to achieve the same quality transmission. Another variation is the adaptive delta modulation (ADM) system. ADM systems are also relatively complex and expensive while requiring a fairly broad transmission bandwidth.

Other systems employ rate coding whereby the amplitude of the analog signal is encoded by a plurality of pulses of equal magnitude such that the frequency of the series of pulses are representative of the amplitude of the analog signal. In such a system, the decoder determines the frequency of the received pulses by counting the number of pulses detected within a predetermined time window. Thus, such a rate coding system requires the transmission of a plurality of pulses at a particular frequency in order to inform the decoder of each incremental change in amplitude level. Accordingly, for a rapidly varying analog signal, the system must be capable of transmitting pulses at a very high frequency as well as receiving and decoding these pulses at a very high rate. Therefore, to obtain the responsiveness typically needed for these types of systems, the encoder and decoder are typically relatively complex and expensive.

SUMMARY OF THE INVENTION

The pulse coding system of the present invention comprises an encoder for encoding a received analog signal as a series of output pulses and a decoder for receiving the pulses output from the encoder and for generating an output signal corresponding to the analog signal received by the encoder. The encoder includes a first decaying signal source for generating a decaying reference signal and a pulse-generating comparator circuit coupled to an input of the encoder for receiving the analog signal to be encoded. The comparator circuit is further coupled to the output of the first decaying signal source for receiving the decaying reference signal. The comparator circuit compares the amplitude of the received analog signal to the amplitude of the reference signal and generates and outputs a pulse whenever the amplitude of the decaying reference signal falls below that of the received analog signal. The first decaying signal source is coupled to the output of the comparator circuit for receiving the generated pulses. The first decaying signal source responds to the pulses by increasing the amplitude of the decaying reference signal a predetermined amount for each pulse that is received. To decode the transmitted pulses, the decoder includes a second decaying signal source for generating the output signal by increasing the amplitude of the decoder output signal by a predetermined amount for each pulse that is received and subsequently allowing the amplitude to decay after each increase in amplitude.

Preferably, the decaying signals generated by both the decaying signal sources decays logarithmically as a function of the signal amplitude. The generated decaying signals preferably decay at a rate that is greater than any expected rate at which the received analog input signal may fall in amplitude. Such a system allows the pulses transmitted to be of uniform amplitude and duration.

Unlike the rate coding system described above, the present invention allows for the decoder to be responsive to each pulse that is transmitted, and therefore, the inventive system does not require the decoder to wait for a predetermined time period to determine how many pulses were received each time it has to determine whether or not to increase or decrease the amplitude of the output signal. Thus, the system according to the present invention is much more responsive to changes in amplitude of the received analog signal.

These and other features, advantages, and objects of the present invention will be further understood and appreciated by those skilled in the art by reference to the following specification, claims, and appended drawings.

DETAILED DESCRIPTION OF PREFERRED EMBODIMENT

Figure 1:
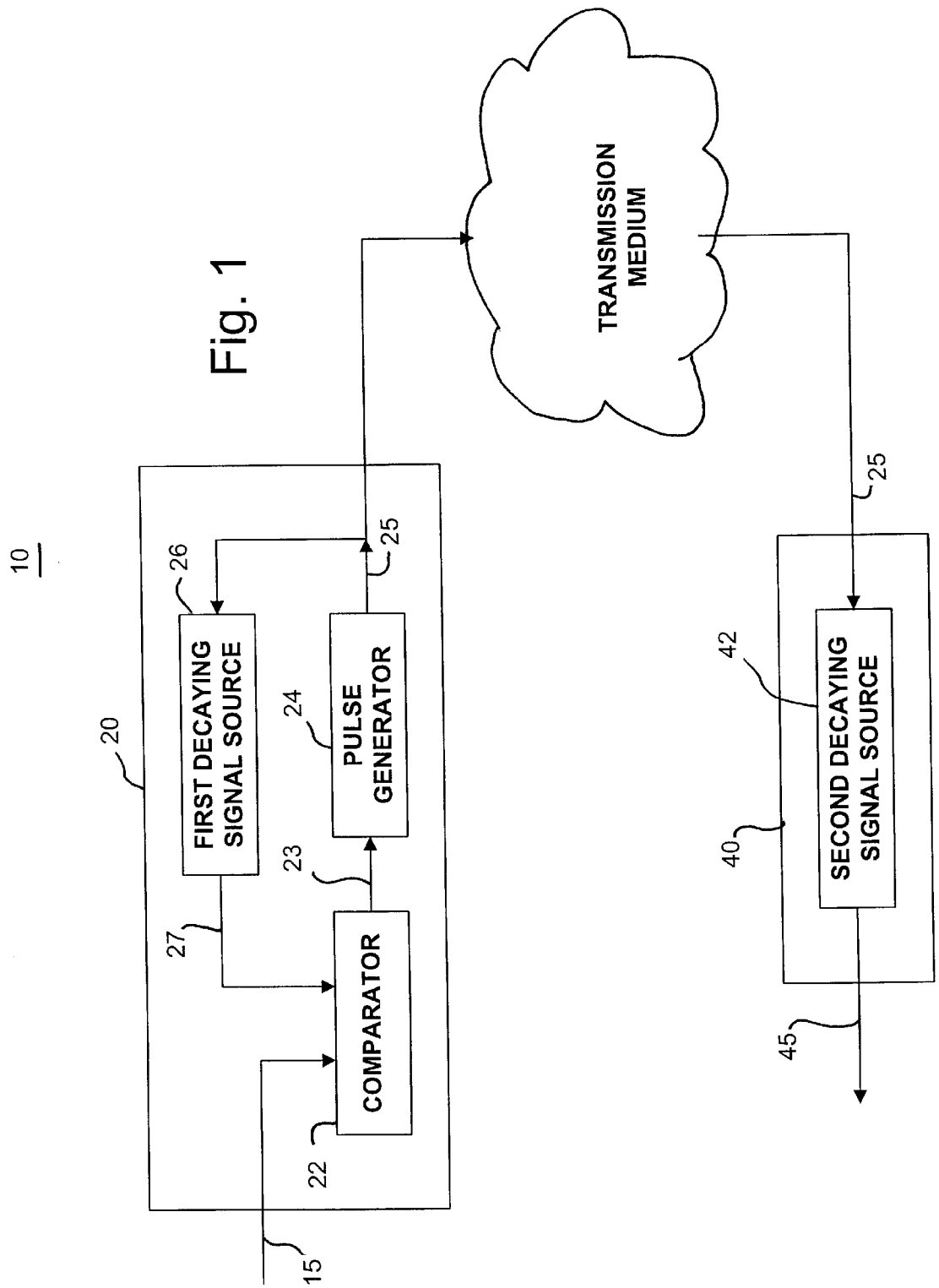
FIG. 1 is an electrical circuit diagram in block form of the pulse coding system of the present invention.

FIG. 1 shows the general construction of a pulse coding system 10 constructed in accordance with the present invention. As shown in FIG. 1, pulse coding system 10 preferably includes an encoder 20 for receiving an analog signal 15 and encoding the received analog signal as a series of pulses 25 that may be transmitted through any form of transmission medium 30 to a decoder 40. The decoder 40 receives and decodes the transmitted pulses 25 and outputs an analog signal 45 corresponding to analog signal 15 as received by encoder 20. By encoding analog signal 15 as a series of pulses 25 that are of equal magnitude and possibly equal duration (depending on implementation), decoder 40 can decode the series of pulses 25 to reconstruct analog signal 15 regardless of the presence of noise in transmission medium 30. Transmission medium 30 may take any conventional form of wired or wireless communication links.

As shown in FIG. 1, encoder 20 includes a comparator 22 for receiving analog signal 15 and comparing its amplitude to the amplitude of a reference signal 27 generated internally within encoder 20. Whenever comparator 22 determines that the amplitude of analog signal 15 exceeds that of reference signal 27, comparator 22 transmits a pulse enable signal 23 to a pulse generator 24, which responds by generating a pulse of uniform height and duration. As used herein, the term "pulse-generating comparator circuit" refers to either comparator 22 or the combination of comparator 22 and pulse generator 24. As will be apparent to those skilled in the art, the invention may be implemented without pulse generator 24 whereby the pulses output from comparator 22 serve as the output of encoder 20. By utilizing pulse generator 24, however, the transmitted pulses will be of uniform duration.

Figure 2:
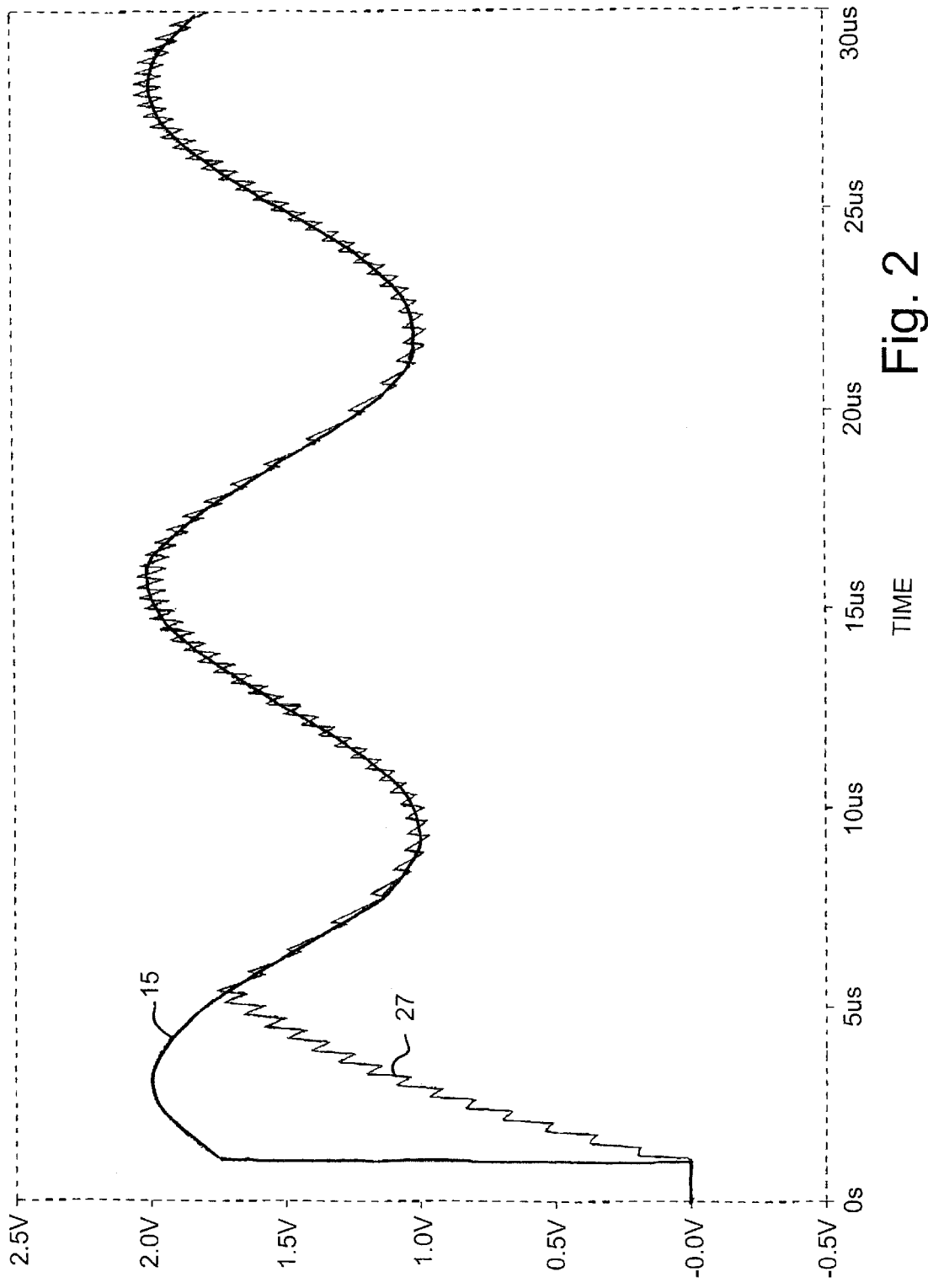
FIG. 2 is a graph illustrating an exemplary analog input signal and the resultant output of the decaying signal source of the encoder of the present invention.

Encoder 20 further includes a first decaying signal source 26 that is coupled to the output of pulse generator 24 and responsive to each generated pulse. First decaying signal source 26 generates reference signal 27 that has an amplitude that decays at a rate that is a function of the reference signal amplitude. Each time a pulse is received from pulse generator 24, first decaying signal source 26 instantaneously increases the amplitude of the decaying reference signal 27 by a predetermined amount. Thus, as illustrated in the exemplary graph shown in FIG. 2, decaying reference signal 27 will closely track analog input signal 15 by continuously decaying to an amplitude below that of analog signal 15 and being instantaneously boosted to an amplitude level just above analog signal 15 where it remains until such time that the decaying amplitude of reference signal 27 falls back below the amplitude of analog input signal 15. As shown in FIG. 2, the time period between each occurrence where the amplitude of the reference signal falls below that of the analog input signal will vary based upon the rate at which the analog input signal 15 is increasing or decreasing.

Figure 3:
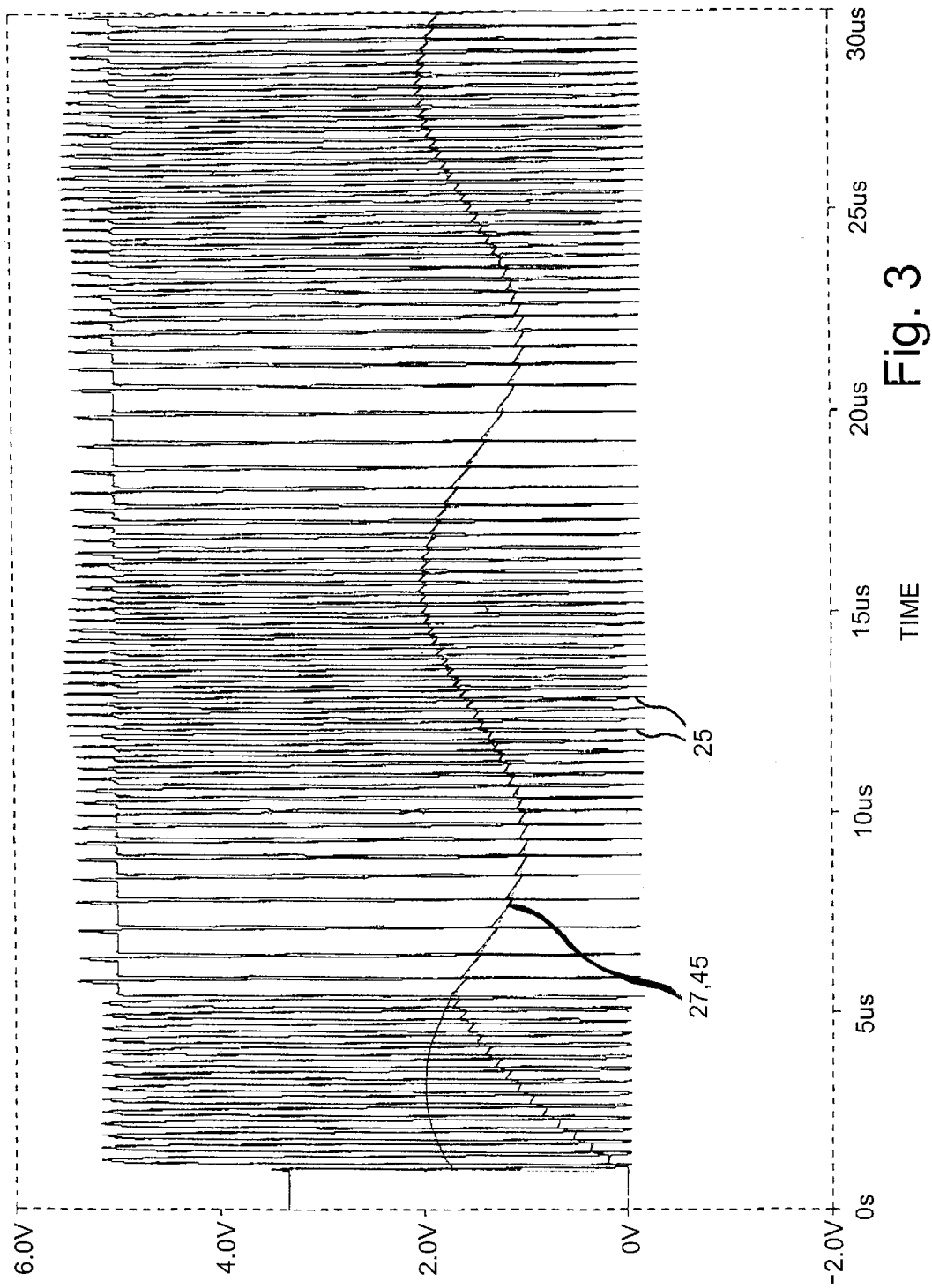
FIG. 3 is a graph illustrating an exemplary output of the pulse generator and the resultant output of the second decaying signal source provided in the decoder of the present invention.

As noted above, pulse generator 24 generates a pulse each time comparator 22 detects that the amplitude of analog input signal 15 exceeds that of decaying reference signal 27. The pulses generated by pulse generator 24 and transmitted as a series of pulses 25 may take the form shown in the example illustrated in FIG. 3. Generally, the amplitude of each of the pulses is equal and the width of each pulse is also equal. The amplitude of the pulses is preferably selected to be the most suitable for the transmission medium utilized. As also shown in FIG. 3, each time a pulse is output from pulse generator 24, the amplitude of decaying reference signal 27 is increased by a predetermined amount.

Referring back to FIG. 1, decoder 40 includes a second decaying signal source 42. Second decaying signal source 42 is preferably identical in construction to that of first decaying signal source 26 as used in encoder 20. With an identical construction, second decaying signal source 42 will respond to the series of pulses 25 as output from pulse generator 24, in the same manner as first decaying signal source 26. Thus, a signal 45 output from second decaying signal source 42 (and decoder 40) will decay at the same rate and therefore be substantially identical to the decaying reference signal 27 generated by first decaying signal source 26. Therefore, as illustrated in FIG. 3, the output signal 45 from decoder 40 will very closely correspond to the analog input signal 15 applied to the input of encoder 20.

Figure 4:
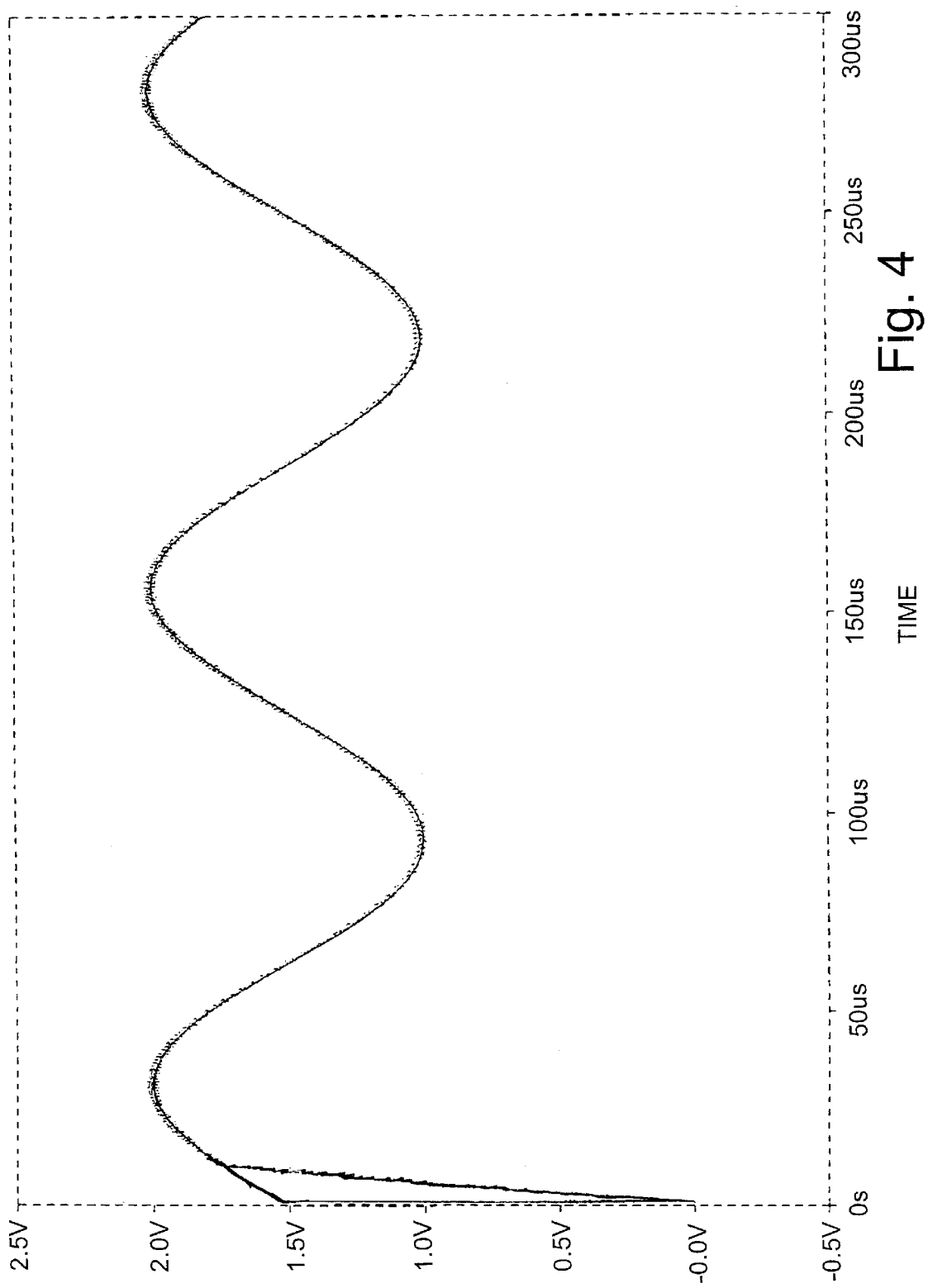
FIG. 4 is a graph illustrating an exemplary received analog signal and the resultant signal output from the decoder of the present invention.

To obtain a more accurate reconstruction of the received analog input signal, the charge injection per pulse may be decreased. In other words, the predetermined amount by which the first and second decaying signal sources 26 and 42 increase the amplitude of the generated decaying signals 27 and 45 in response to a pulse, may be decreased to cause the output signal 45 to more closely track the input analog signal 15. FIG. 4 shows a plot that illustrates the effects of decreasing the charge injection per pulse. It should be noted that by decreasing the charge injection per pulse, the frequency at which pulses are generated and transmitted is correspondingly increased. Thus, as apparent from a comparison of FIGS. 2 and 4, the system can achieve almost arbitrarily good accuracy as the pulse rate increases.

Figure 5:
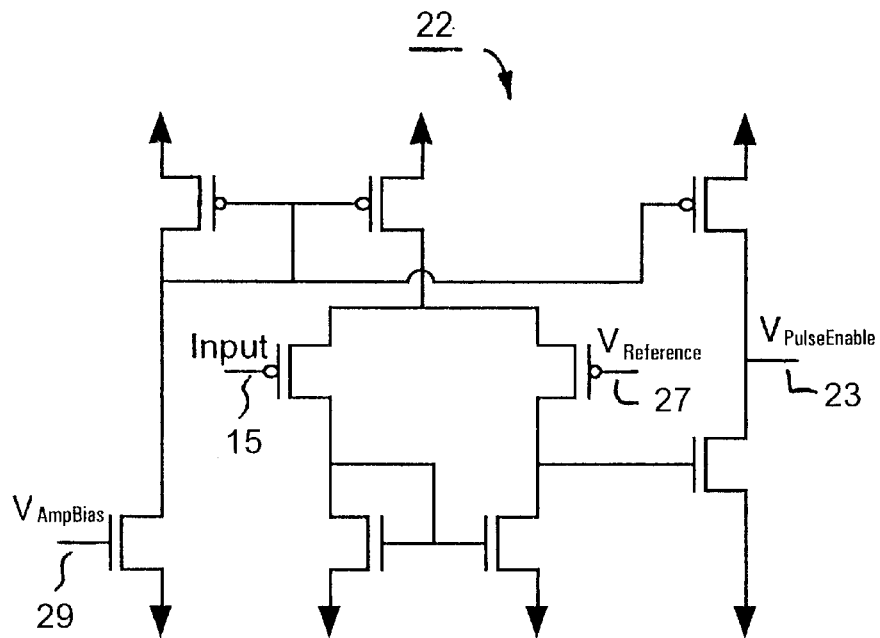
FIG. 5 is an electrical circuit diagram in schematic form of an exemplary comparator for use in the encoder of the present invention.

An example of one implementation of comparator 22 is shown in FIG. 5. In the illustrated implementation of comparator 22 as well as the exemplary implementations shown for pulse generator 24 and decaying signal sources 26 and 42 in FIGS. 6 and 7, the arrows pointing upward represent a connection to system operating voltage $V_{dd}$ while the arrows pointing downward represent connections to ground. As shown in FIG. 5, comparator 22 receives analog signal 15 as one input and receives the decaying reference signal 27 ($V_{Reference}$) as another input. Based upon a comparison of these two inputs, a signal 23 ($V_{PulseEnable}$) is applied to pulse generator 24 to initiate the generation of a pulse. The voltage level of $V_{PulseEnable}$ is at a high logic state when $V_{Reference}$ falls below the amplitude of the input analog signal 15. Comparator circuit 22 may be configured to receive another input 29 ($V_{AmpBias}$), which controls the amplifier bias current.

Figure 6:
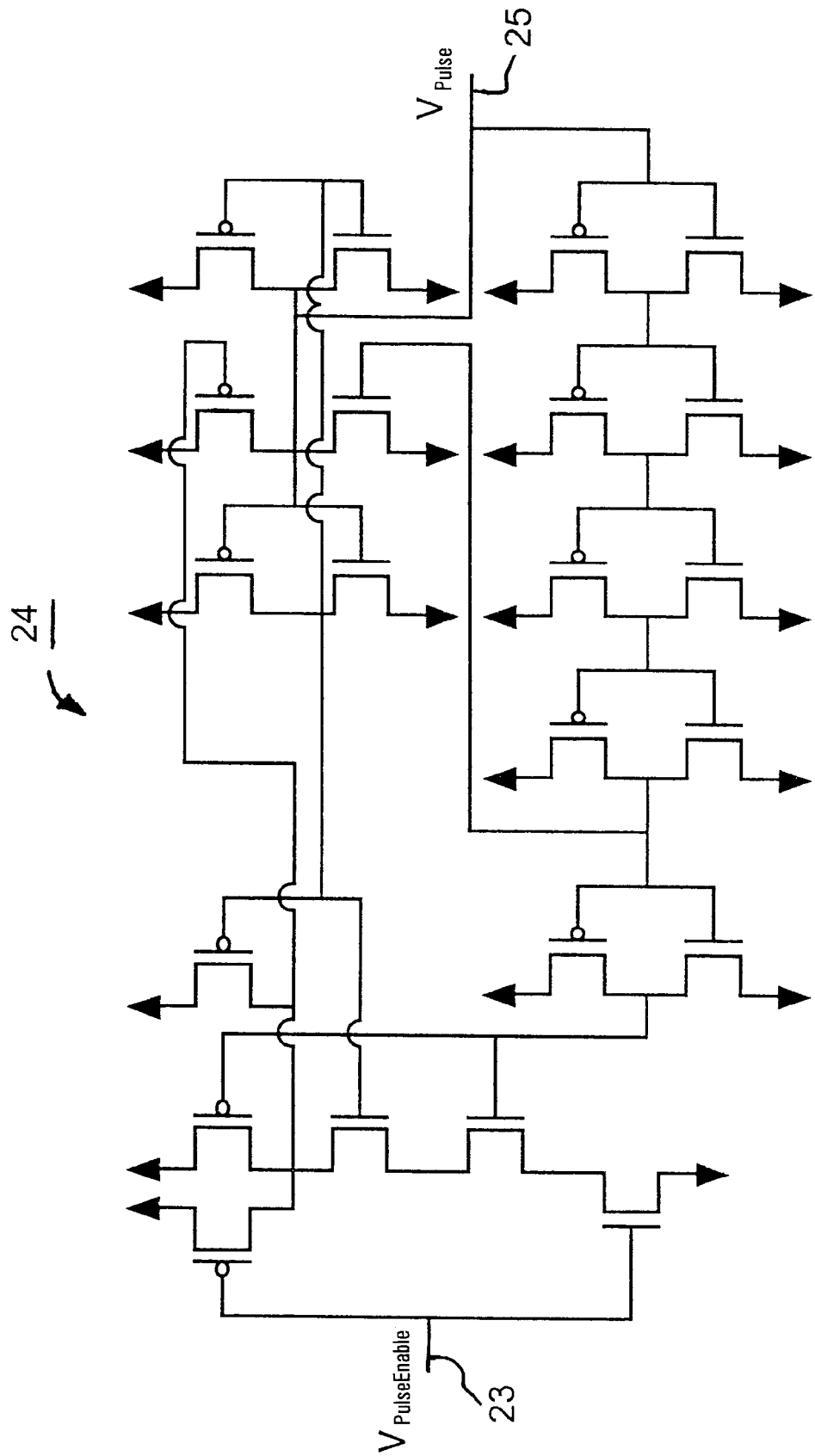
FIG. 6 is an electrical circuit diagram in schematic form of an exemplary pulse generator for use in the encoder of the present invention.

FIG. 6 shows an exemplary implementation that may be used for pulse generator 24. As discussed above, pulse generator 24 responds to the pulse enable signals 23 ($V_{PulseEnable}$) to generate a series of pulses 25 ($V_{Pulse}$). As shown in FIG. 6, pulse generator 24 includes a plurality of stages of differentially connected transistors that respond to the rising edge of each transmitted pulse to subsequently terminate the pulse after a predetermined built-in delay. In this manner, each output pulse will be of the same duration.

Figure 7:
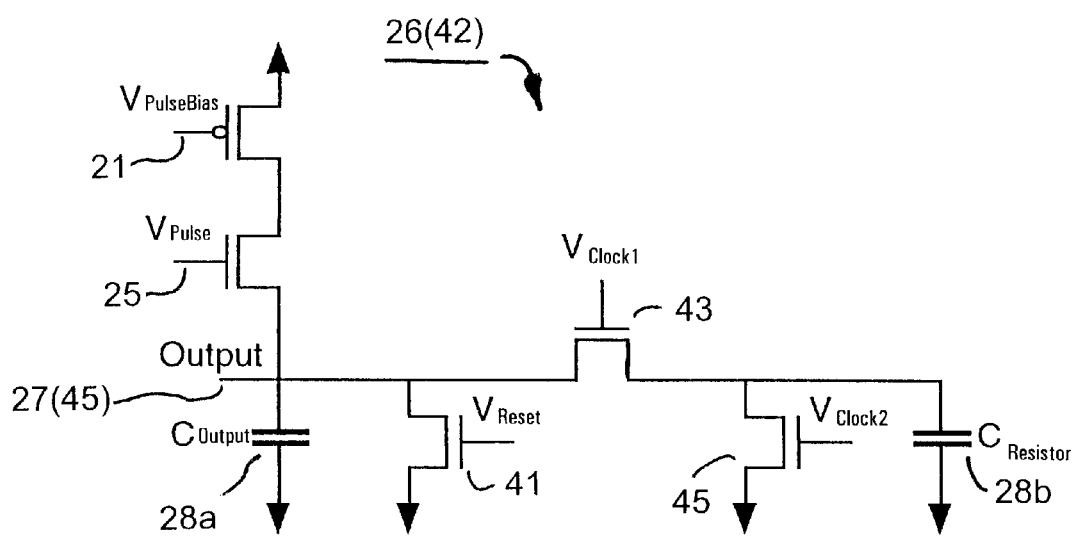
FIG. 7 is an electrical circuit diagram in schematic form of an exemplary decaying signal source for use in both the encoder and decoder of the present invention.

FIG. 7 shows an exemplary construction for decaying signal sources 26 and 42. As apparent from the circuit shown in FIG. 7, each time a pulse ($V_{Pulse}$) is received from the output 25 of pulse generator 24, current is injected into a first output capacitor ($C_{Output}$) 28 a. This injection of current increases the voltage across first capacitor 28a, and hence, increases the voltage level of the decaying reference signal 27 appearing at the output of the decaying signal source. The amount of injected current per received pulse may be varied by applying a pulse width modulated signal 21 ($V_{PulseBias}$) that controls the amount of current that is injected into first capacitor 28a during each receipt of a pulse $V_{Pulse}$. After each pulse-induced current injection, first capacitor 28a is allowed to discharge through a second capacitor 28b ($C_{Resistor}$). The rate at which first capacitor 28a discharges through second capacitor 28b may be controlled by providing transistors 43 and 45 in the manner shown and by applying two separate signals $V_{Clock1}$ and $V_{Clock2}$ which are non-overlapping switched capacitor clock signals. Thus, when transistor 43 is conducting, transistor 45 is turned off and first capacitor 28a is allowed to discharge through capacitor 28b. Subsequently, transistor 43 is clocked off while transistor 45 is conducting thereby allowing second capacitor 28b to discharge to ground through transistor 45. Decaying signal sources 26 and 42 may also include a transistor 41 for receiving a reset signal $V_{Reset}$, which immediately discharges first capacitor 28a to ground when it is conducting.

Figure 8:
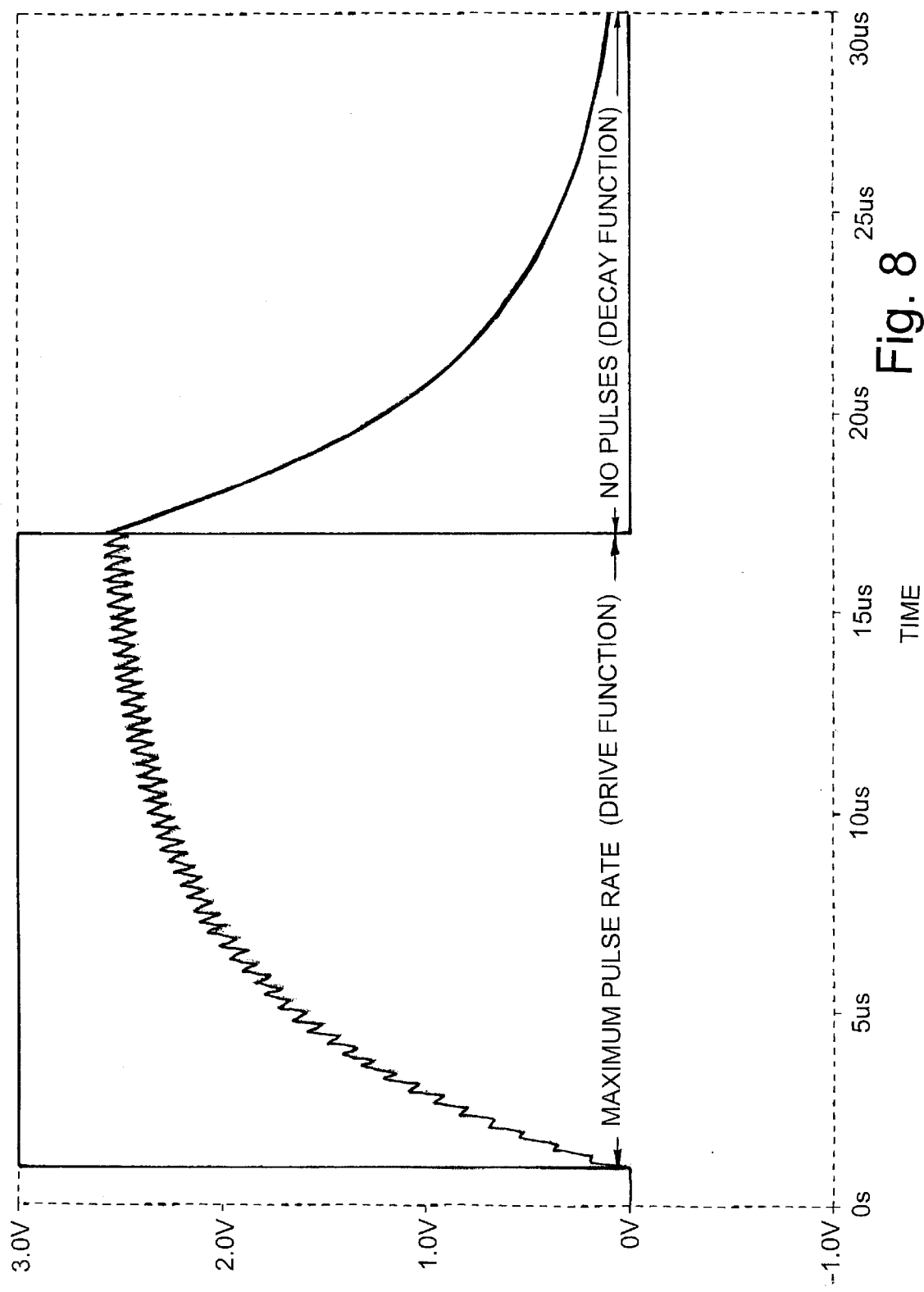
FIG. 8 is a graph illustrating the drive and decay functions for the decaying signal sources used in the encoder and decoder of the present invention.

Exemplary drive and decay functions of the decaying signal sources are illustrated in FIG. 8. As shown in FIG. 8, the decaying signal sources respond more quickly to pulses when the amplitude of the generated signal is at lower voltage levels. Further, the amplitude of the generated signal decays more rapidly when the amplitude is at higher levels. This decay function may be expressed logarithmically.

As discussed above, it is important that decaying signal sources 26 and 42 be constructed such that the decay rate at which the reference signal 27 (or output signal 45) decreases, will not exceed the rate at which the analog input signal could possibly decrease. With this condition met, the encoder will be able to keep its reference signal (27) within one pulse change of the input signal (15) so long as the amplitude of the analog input signal does not increase so fast that a single pulse cannot take the reference signal above the input amplitude level.

As noted above, decaying reference signal 27 and the output 45 of decoder 40 will exhibit the same decay characteristics and both decaying signal sources 26 and 42 receive the same pulse stream 25 as input. If, however, the starting amplitude level of output signal 45 is different from the starting amplitude of reference signal 27, the amplitude of output signal 45 would not correspond to that of the analog input signal 15. However, because the decay functions of first and second decaying signal sources 26 and 42 are convex (i.e., logarithmic), such that the signals decay at a faster rate when they are at higher amplitude levels, the amplitude levels of output signal 45 and reference signal 27 will eventually become equal and therefore respond to the pulses in the same manner such that output signal 45 would then have an amplitude that corresponds to that of analog input signal 15. For example, if the starting amplitude of output signal 45 is greater than that of reference signal 27, output signal 45 will decay at a faster rate between pulses than reference signal 27. The decay at a different rate will continue until the amplitude of output signal 45 is equal to that of reference signal 27. On the other hand, if the starting amplitude of output signal 45 is less than that of reference signal 27, output signal 45 will decay at a slower rate between pulses than reference signal 27. Thus, because reference signal 27 would decay at a faster rate than output signal 45, the amplitude of reference signal 27 will eventually fall down to the same level as that of output signal 45. Thus, the initial levels of the reference and output signals are not significant because, after being influenced by the same pulse stream for some amount of time, they will become identical.

This self-correction of the output level has another benefit. When the pulse transmission channel is noisy, the pulse stream received by decoder 40 may not be the same as the pulse stream applied to first decaying signal source 26 in encoder 20. If second decaying signal source 42 receives one extra pulse, the amplitude of output signal 45 will go higher than that of reference signal 27. However, the amplitude level of output signal 45 will then decay faster than that of reference signal 27 until output signal 45 is once again at the same amplitude as reference signal 27. Likewise, if a pulse is accidentally not received or detected by decoder 40, the amplitude level of output signal 45 will fall below that of reference signal 27. Again, however, the amplitude of output signal 45 will then decay more slowly than that of reference signal 27 until the two once again become equal. Thus, the signal self-correction feature provides this encoding scheme with a degree of robustness to noisy transmission lines.

Accordingly, the preferred embodiment system is a pulse coding system that is less expensive and less complex than the prior systems. It nevertheless can achieve almost arbitrarily good accuracy and does not require a broad transmission bandwidth. It is relatively immune from the presence of noise in the environment through which the encoded signal is transmitted.

Although the present invention has been described with reference to specific constructions for the elements of the present invention, it will be appreciated by those skilled in the art that other constructions may be utilized without departing from the scope of the present invention.

The above description is considered that of the preferred embodiment only. Modifications of the invention will occur to those skilled in the art and to those who make or use the invention. Therefore, it is understood that the embodiment shown in the drawings and described above is merely for illustrative purposes and not intended to limit the scope of the invention, which is defined by the following claims as interpreted according to the principles of patent law, including the Doctrine of Equivalents.

The invention claimed is:

1. A pulse coding system comprising:
   an encoder for encoding a received analog signal as a series of output pulses, said encoder including:
   a first decaying signal source for generating a decaying reference signal; and
   a pulse-generating comparator circuit coupled to an input of said encoder for receiving the analog signal to be encoded and coupled to said first decaying signal source for receiving the decaying reference signal, said pulse-generating comparator circuit compares the amplitude of the received analog signal to the amplitude of said reference signal and generates and outputs a pulse whenever the amplitude of the decaying reference signal falls below that of the received analog signal,
   wherein said first decaying signal source is coupled to said pulse-generating comparator circuit for receiving the generated pulses, and wherein said first decaying signal source responds to the pulses by increasing the amplitude of the decaying reference signal a predetermined amount each time a pulse is received; and
   a decoder for receiving the pulses output from said encoder and for generating an output signal corresponding to the analog signal received by said encoder, said decoder including a second decaying signal source for generating the output signal by increasing the amplitude of the output signal by a predetermined amount each time a pulse is received and subsequently allowing the amplitude to decay after each increase in amplitude.

2. The pulse coding system as defined in claim 1, wherein said pulse-generating comparator circuit includes a comparator for comparing the amplitude of the received analog signal to the amplitude of said reference signal and generates a pulse enable signal when the amplitude of the received analog signal exceeds that of the reference signal.

3. The pulse coding system as defined in claim 2, wherein said pulse-generating comparator circuit further includes a pulse generator coupled to said comparator for generating said series of pulses in response to the pulse enable signal generated by said comparator.

4. The pulse coding system as defined in claim 1, wherein said first and second decaying signal sources have identical construction.

5. The pulse coding system as defined in claim 1, wherein said first and second decaying signal sources exhibit the same decaying characteristics.

6. The pulse coding system as defined in claim 1, wherein said first and second decaying signal sources both exhibit a decaying characteristic in which the rate of signal decay varies as a function of the amplitude of the signals output from said first and second decaying signal sources.

7. The pulse coding system as defined in claim 6, wherein the rate of signal decay increases with increasing amplitude levels of the output signals.

8. The pulse coding system as defined in claim 1, wherein the pulses generated by said pulse-generating comparator circuit are of uniform amplitude and duration.

9. An encoder for use in a pulse encoding system that encodes a received analog signal as a series of transmitted pulses and subsequently decodes the series of transmitted pulses to produce a signal substantially corresponding to the received analog signal, said encoder comprising:

a decaying signal source for generating a decaying reference signal; and a pulse-generating comparator circuit for receiving the analog signal to be encoded and coupled to said decaying signal source for receiving the decaying reference signal, said pulse-generating comparator circuit compares the amplitude of the received analog signal to the amplitude of said reference signal and generates and outputs a pulse whenever the amplitude of the decaying reference signal falls below that of the received analog signal, wherein said decaying signal source is coupled to said pulse-generating comparator circuit for receiving the generated pulses, and wherein said decaying signal source responds to the pulses by increasing the amplitude of the decaying reference signal a predetermined amount each time a pulse is received.

10. The encoder as defined in claim 9, wherein said decaying reference signal generated by said decaying signal source decays logarithmically with respect to the amplitude of the reference signal.

11. The encoder as defined in claim 9, wherein the rate at which the decaying reference signal decays is greater than any expected rate at which the received analog input signal may fall in amplitude.

12. The encoder as defined in claim 9, wherein the pulses generated by said pulse-generating comparator circuit are of uniform amplitude and duration.

13. The encoder as defined in claim 9, wherein said pulse-generating comparator circuit includes a comparator for comparing the amplitude of the received analog signal to the amplitude of said reference signal and generates a pulse enable signal when the amplitude of the received analog signal exceeds that of the reference signal.

14. The encoder as defined in claim 13, wherein said pulse-generating comparator circuit further includes a pulse generator coupled to said comparator for generating said series of pulses in response to the pulse enable signal generated by said comparator.

15. A method of encoding an analog signal as a series of pulses comprising the steps of:

(a) generating a decaying reference signal;

(b) comparing the amplitudes of the decaying reference signal and the received analog signal;

(c) transmitting a pulse when the amplitude of the decaying reference signal falls below the amplitude of the received analog input signal;

(d) increasing the amplitude of the decaying reference signal by a predetermined amount each time a pulse is transmitted;

(e) repeating steps (b) through (d) above to transmit a series of pulses; and (f) decoding the transmitted series of pulses to generate an output signal corresponding substantially to the received analog signal.

16. The method as defined in claim 15, wherein step (f) includes the substeps of:

receiving the series of transmitted pulses;

generating a second decaying signal;

increasing the amplitude of the second decaying signal by a predetermined amount each time a pulse is received; and outputting the second decaying signal as the output signal.

17. A method of encoding and decoding an analog signal comprising the steps of:

encoding the analog signal as a series of uniform pulses;

transmitting the series of uniform pulses;

receiving the series of transmitted pulses;

generating a decaying signal;

increasing the amplitude of the decaying signal by a predetermined amount each time a pulse is received; and outputting the decaying signal as an output signal, which corresponds substantially to the analog signal.

18. The method as defined in claim 17, wherein the step of encoding the analog signal includes the substeps of:

(a) generating a decaying reference signal;

(b) comparing the amplitudes of the decaying reference signal and the received analog signal;

(c) transmitting a pulse when the amplitude of the decaying reference signal falls below the amplitude of the received analog input signal;

(d) increasing the amplitude of the decaying reference signal by a predetermined amount each time a pulse is transmitted; and (e) repeating steps (b) through (d) above to transmit a series of pulses.

* * * * *